United States Patent
Pan

(10) Patent No.: US 6,265,280 B1
(45) Date of Patent: Jul. 24, 2001

(54) METHOD FOR MANUFACTURING A CYLINDRICAL SEMICONDUCTOR CAPACITOR

(75) Inventor: Yang Pan, Singapore (SG)

(73) Assignee: Chartered Semiconductor Manufacturing, Inc., Milpitas, CA (US)

( * ) Notice: Subject to any disclaimer, the term of this patent is extended or adjusted under 35 U.S.C. 154(b) by 0 days.

(21) Appl. No.: 09/450,925

(22) Filed: Nov. 29, 1999

(51) Int. Cl.[7] .................................................. H01L 21/20
(52) U.S. Cl. ................................ 438/396; 438/3; 438/240
(58) Field of Search .............................. 438/396, 3, 240, 438/253, 254, 255, 397, 398, 250, 393; 257/296, 307, 308

(56) References Cited

U.S. PATENT DOCUMENTS

| 5,998,256 | * | 12/1999 | Juengling | 438/253 |
| 6,140,178 | * | 10/2000 | Tseng | 438/253 |
| B1 6,168,988 | * | 1/2001 | Schindler et al. | 438/253 |

OTHER PUBLICATIONS

Drynan et al., "Cylindrical Full Metal Capacitor Technology for High–Speed Gigabit DRAMs", Symposium on VLSI Tech. Dig. of Technical Papers, 1997, pp. 151–152.*

Small et al., "Zerodur 0.5 Pf Toroidal Cross Capacitor", IEEE, 2000, pp. 129–130.*

* cited by examiner

Primary Examiner—Tuan H. Nguyen
(74) Attorney, Agent, or Firm—Mikio Ishimaru

(57) ABSTRACT

A cylindrical semiconductor capacitor and manufacturing method is provided which starts by taking an oxide layer which is formed over a semiconductor substrate and simultaneously removing a cylindrical volume and a toroidal volume around the cylindrical volume. The removed cylindrical and toroidal volumes are filled with a copper/tantalum nitride conductor to form a metal cylinder and ring. An oxide ring between the conductive cylinder and ring is removed. A high dielectric constant material is formed to replace the oxide ring between the metal cylinder and ring to form a cylindrical capacitor. Additional oxide material is deposited, patterned, and filled with copper/tantalum nitride conductor a to make a first connection to the metal ring, and a further dielectric is deposited, patterned, and filled with additional copper/tantalum nitride conductor to form a second connection to the metal cylinder.

17 Claims, 4 Drawing Sheets

METHOD FOR MANUFACTURING A CYLINDRICAL SEMICONDUCTOR CAPACITOR

TECHNICAL FIELD

The present invention relates generally to integrated circuit devices and manufacturing, and more particularly to cylindrical semiconductor capacitors and manufacturing.

BACKGROUND

Capacitors are used in a number of different applications in integrated circuit devices. One application is as decoupling capacitors, which are used with large scale integrated circuits having a high number of driver circuits. Another application is as memory capacitors, which are used in integrated circuit memory cells having a high integration density and which use a combination of the transistor and the memory capacitor in a memory cell.

Capacitors are used in decoupling applications because the driver circuit power connections in integrated circuits are particularly sensitive to noise created by the effective inductance inherent in simultaneous switching activity as occurs with parallel processing. Further, the trend towards higher speed and lower power consumption of semiconductor devices, such as microcomputers and digital signal processors, has caused greater problems with electromagnetic interference or electromagnetic noise. The most effective measure against noise has been to use a decoupling capacitor so that the switching noise will not be coupled to a signal line through a common main power source circuit. Such a decoupling capacitor serves as a power source that can be easily utilized for switching the semiconductor element, such as a transistor. The decoupling capacitor is charged by an external power source and is rapidly discharged to give a switching current which minimizes electromagnetic noise. At the same time, the switching speed of the logic circuit is related to the inductance of the current path between the semiconductor element and the capacitor. In order to minimize the inductance and inductive noise, the semiconductor element and the capacitor must be arranged very close to each other, and a number of short current paths must be provided between the semiconductor element and the capacitor.

Semiconductor devices have been developed with decoupling capacitors disposed neighboring each of the semiconductor elements on the upper surface of the semiconductor substrate as one attempt to solve the problems associated with these decoupling capacitors but these arrangements continue to encounter problems as sizes shrink.

In the memory capacitor application, recent largecapacity DRAMs (Dynamic Random Access Memories) have to have stacked capacitor structures in which information-storing capacitors are arranged above memory-cell-selecting transistors. These stacked capacitor structures compensate for the decrease of accumulated charges because the memory cells are micro-miniaturized. Even with this reduction in the size of the memory cell, it is necessary to maintain the capacitance to insure stable operation, and as sizes shrink, the problems continue to return.

Numerous cylindrical capacitors have been developed for use in integrated circuits, but they are primarily based on modifications of the polysilicon structure and/or require a large number of steps in their manufacture. A high capacitance, easily manufactured capacitor for semiconductor devices and these applications have long been sought but has eluded those skilled in the art.

DISCLOSURE OF THE INVENTION

The present invention provides a method for making a semiconductor capacitor by taking a dielectric layer which is formed over a semiconductor substrate and simultaneously removing a core volume and a toroidal volume around the core volume. The removed core and toroidal volumes are filled with a conductive material to form a conductive material core and a conductive material toroidal ring. A dielectric ring between the conductive material core and ring is removed. A second dielectric material is formed to replace the dielectric ring between the conductive material core and ring to form a capacitor. Additional dielectric material is deposited, patterned, and filled with conductive material to make a first connection to the ring, and a further dielectric is deposited, patterned, and filled with conductive material to form a second connection to the core. This method allows using a back end process which is simple and compatible with conventional integrated circuit processes.

The present invention further provides a method for making a cylindrical semiconductor capacitor by taking an oxide layer which is formed over a semiconductor substrate and simultaneously removing a cylindrical volume and a toroidal volume around the cylindrical volume. The removed cylindrical and toroidal volumes are filled with a copper/tantalum nitride conductor to form a metal cylinder and a metal ring. An oxide ring between the metal cylinder and ring is removed. A high dielectric constant material is deposited to replace the oxide ring between the metal cylinder and ring to form a cylindrical capacitor. Additional oxide material is deposited, patterned, and filled with copper/tantalum nitride conductor to make a first connection to the metal ring, and a further dielectric is deposited, patterned, and filled with additional copper/tantalum nitride conductor to form a second connection to the metal cylinder. This method allows using a back end process which is simple and compatible with conventional integrated circuit processes.

The present invention further provides a cylindrical semiconductor capacitor made up of a central metal cylinder surrounded by a dielectric ring which in turn is surrounded by a further toroidal metal ring. The metal cylinder and ring form the anode and cathode of the capacitor, and the capacitance can be controlled by the dimensions of the capacitor and the dielectric constant of the high dielectric constant material.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
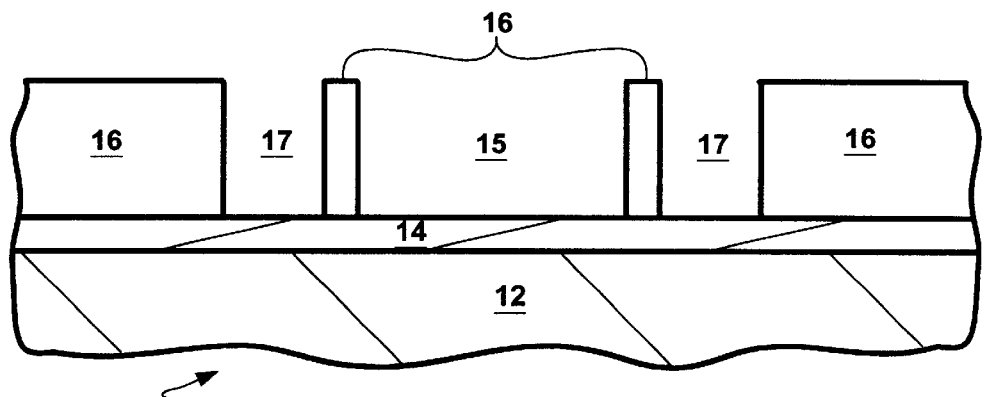
FIG. 1 is a diagramatic cross section of a semiconductor device after an oxide etch step of the present invention.

Referring now to FIG. 1, therein is shown an initial step in the formation of a cylindrical semiconductor capacitor 10 of the present invention. FIG. 1 shows a semiconductor substrate 12 having a base dielectric or silicon nitride layer 14 deposited thereon. An interlayer dielectric or oxide (silicon dioxide) layer 16 has been deposited over the silicon nitride layer 14. The oxide layer 16 has been patterned and etched using conventional photolithographic processes to form a cylindrical volume 15 and a toroidal volume 17 which are separated by a toroidal oxide ring of the oxide layer 16.

As would be evident to those skilled in the art, the cylindrical volume 15, which makes up the core of the capacitor 10, is not limited to a cylindrical shape but may be of any solid or hollow shape. Similarly, the toroidal volume 17, which makes up a ring around the core need not have the rectangular cross section shown, although this cross section is preferred.

Figure 2:
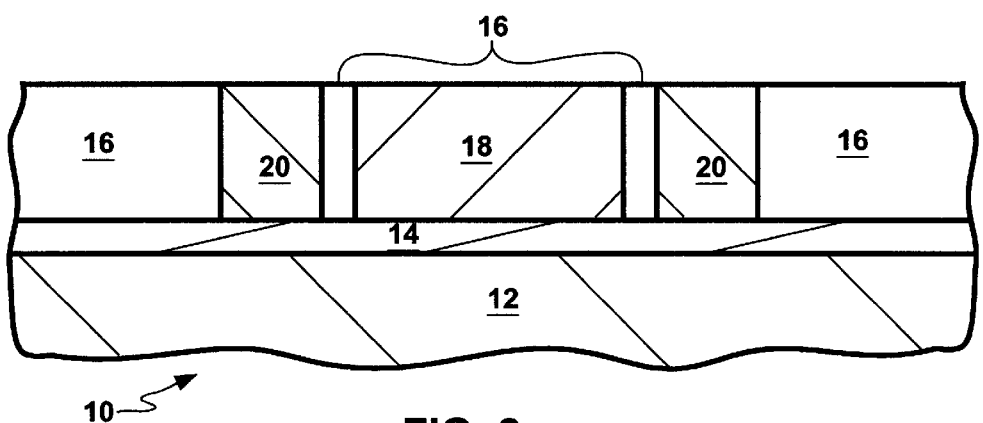
FIG. 2 is a diagramatic cross section after a metal deposition step of the present invention.

Referring now to FIG. 2, therein is shown a diagramatic cross-section after a metal deposition step of the present invention. A conductive material has been deposited in the cylindrical volume 15 and in the toroidal volume 17 to form a conductive cylinder 18 and a toroidal conductive ring 20. The conductive ring 20 would have a generally rectangular cross-section. For highly diffusive conductors, a barrier layer (not shown) will be deposited prior to deposition of the conductive material. For example, for copper, a thin tantalum nitride barrier layer would be deposited initially to prevent detrimental electro-migration of copper into the remainder of the semicoductor. This preliminary step is well known to those skilled in the art. Other conductive materials include aluminum, gold, silver, and alloys thereof, compounds thereof, and polysilicon. Since these materials would also be deposited on the top of the oxide layer 16, a conventional chemical-mechanical polishing (CMP) process would then be used to damascene the conductive material to form the cylinder 18 and the conductive ring 20.

Figure 3:
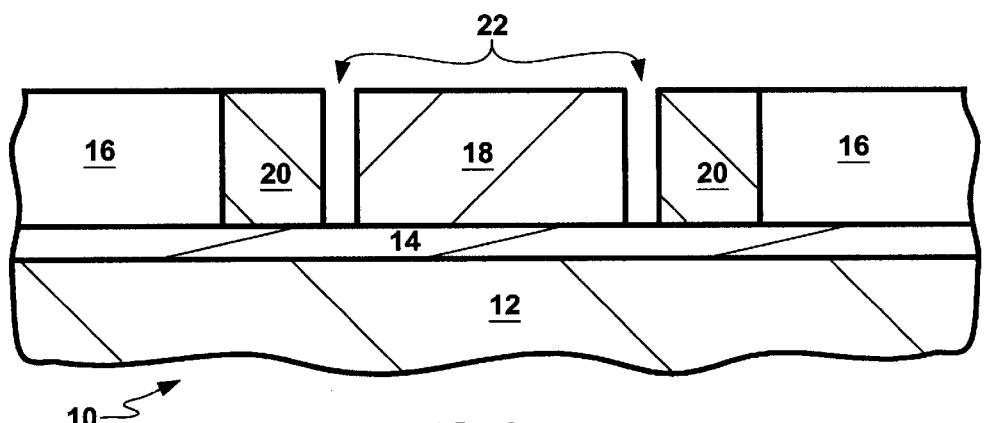
FIG. 3 is a diagramatic cross section after a second oxide etch step of the present invention.

Referring now to FIG. 3, therein is shown a diagramatic cross-section after a second oxide etch step of the present invention. Through another masking and etching step, the oxide layer 16 would be removed from between the cylinder 18 and the conductive ring 20 to form the toroidal volume 22.

Figure 4:
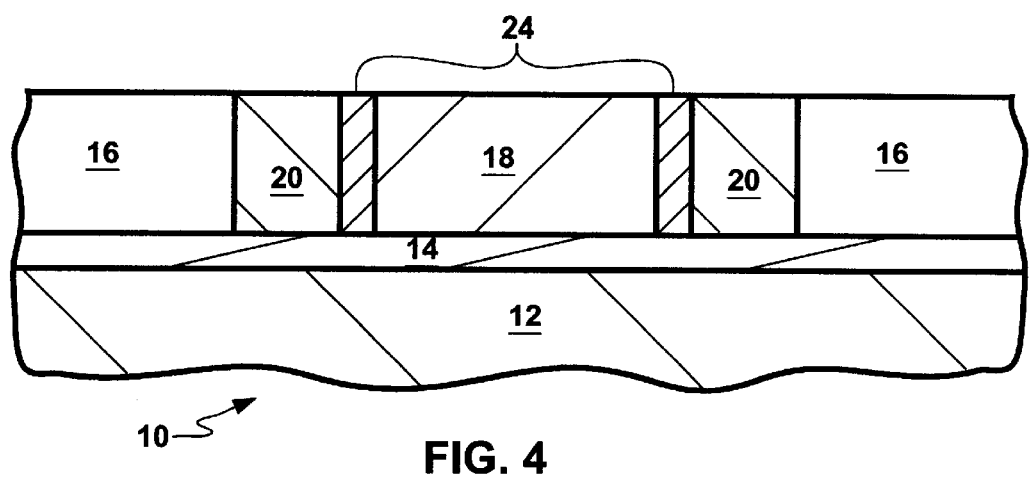
FIG. 4 is a diagramatic cross section after a capacitor dielectric deposition step of the present invention.

Referring now to FIG. 4, therein is shown a diagramatic cross-section after a capacitor dielectric deposition step of the present invention. FIG. 4 shows a step after a dielectric material has been deposited over the surface of the oxide layer 16, the cylinder 18, and the conductive ring 20 into a toroidal volume 22. A CMP process has been used to polish the dielectric material level with the surface of the oxide layer 16 leaving a toroidal dielectric ring 24 between the cylinder 18 and the conductive ring 20. The dielectric ring 24 may be a spin-on dielectric and may have a controlled, preferably a high, dielectric constant. The higher the dielectric constant, the more charge can be stored in the capacitor. Examples of the high dielectric materials having dielectric constants of 20 and higher are tantalum pentoxide ($Ta_2O_5$), which has a dielectric constant of between 20 and 40, and bariam strontium titanate (BST), which has a dielectric constant of between 200 and 400.

Figure 5:
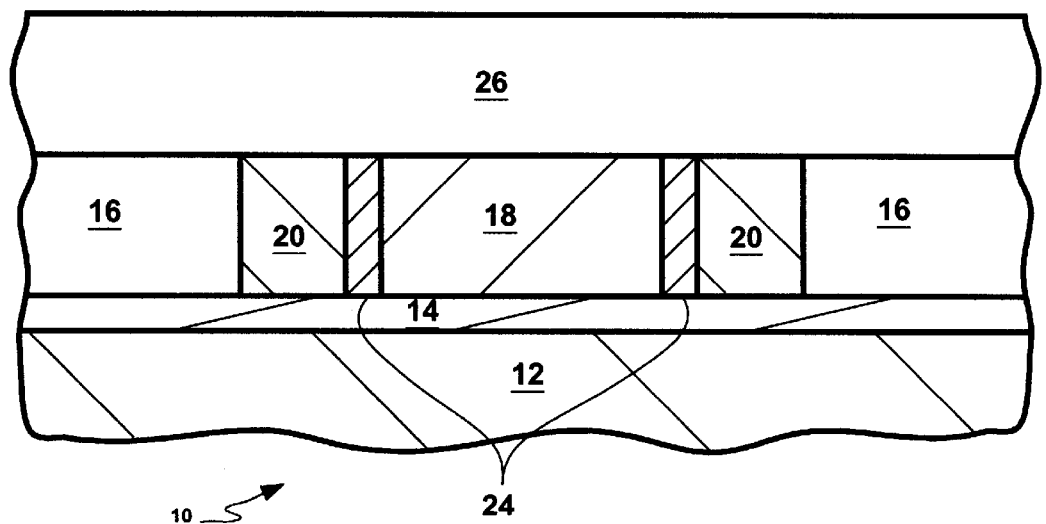
FIG. 5 is a diagramatic cross section after a first channel dielectric deposition step of the present invention.

Referring now to FIG. 5, therein is shown a diagramatic cross-section after a first channel dielectric deposition step of the present invention. A first channel dielectric 26, or oxide layer, is deposited over the surface of the oxide layer 16, the cylinder 18, the dielectric ring 24, and the conductive ring 20.

Figure 6:
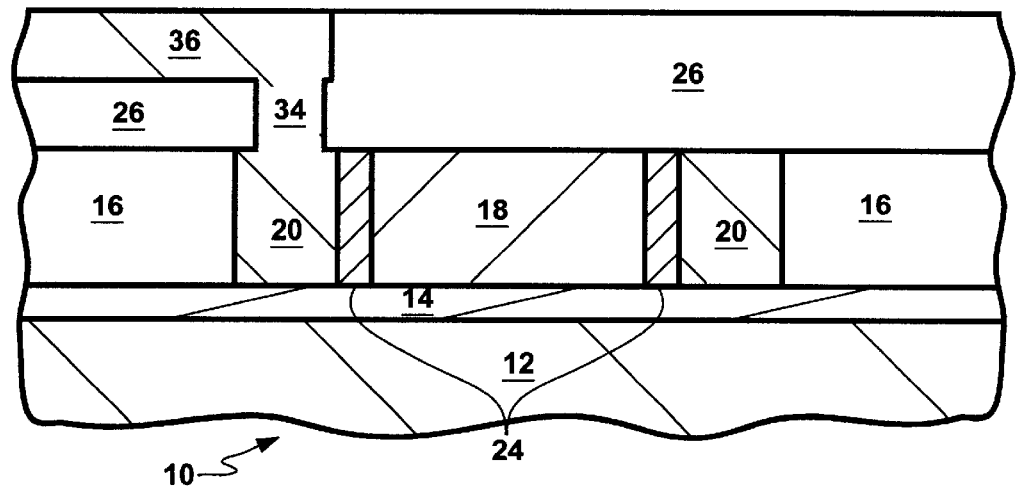
FIG. 6 is a diagramatic cross section after a first channel and via formation step of the present invention.

Referring now to FIG. 6, therein is shown a diagramatic cross-section after a first channel and via formation step of the present invention. Several steps have been completed here. The first channel dielectric 26 has been patterned, etched, and filled with a conductive material to form a first channel 36 and a conductive via 34 which are in conductive contact with the conductive ring 20. Again, depending on the conductive material used for the via conductive and the first channel 36, a barrier layer and a seed layer may be deposited. Generally, an isotropic etching process would be used to form the first channel 36 and the conductive via 34 at the same time so they may be both be filled at the same time. The top of the first channel 36 and the first channel dielectric 26 have been planarized by a CMP process in FIG. 6.

Figure 7:
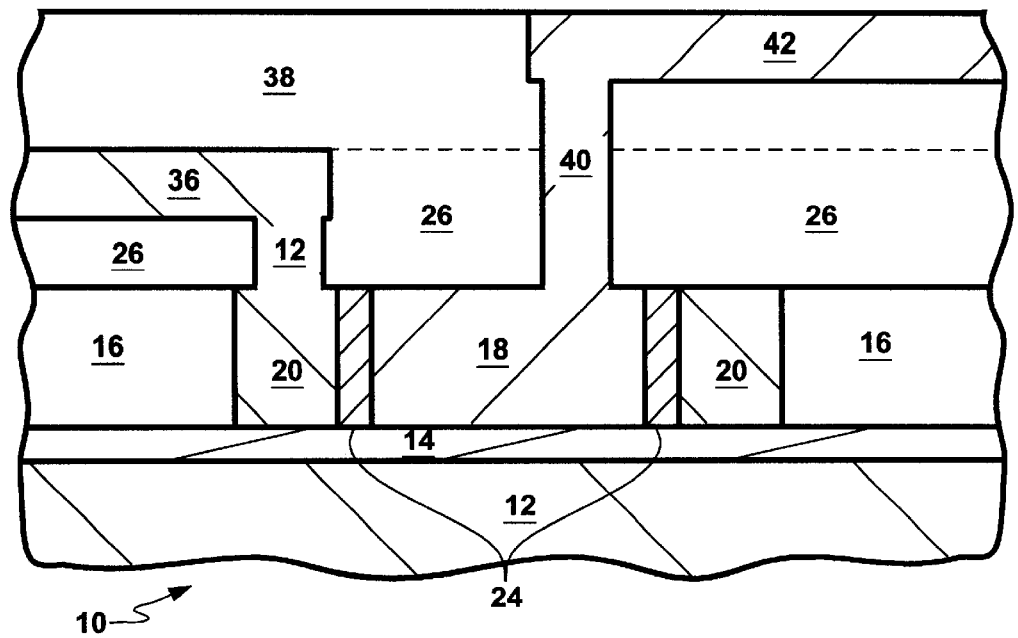
FIG. 7 is a diagramatic cross section after a second channel and via formation step of the present invention.

Referring now to FIG. 7, therein is shown a diagramatic cross-section after a second channel and via formation step of the present invention. At this point, several steps have been performed similar to those described above. First, a second channel dielectric 38, or oxide layer, has been deposited on top of the first channel dielectric 26. It has been patterned by a conventional photolithographic process, etched with an isotropic etching process, and filled with a conductive material so as to form a conductive via 40 and a second channel 42 in conductive contact with the cylinder 18. The top of the second channel 42 and the second channel dielectric 38 have been planarized by a CMP process. The second channel dielectric 38 is of the same material as the first channel dielectric 26 and will become integral therewith. As previously described, the conductive via 40 and the second channel 42 may have a barrier layer and a seed layer deposited before the primary conductive material.

Figure 8:
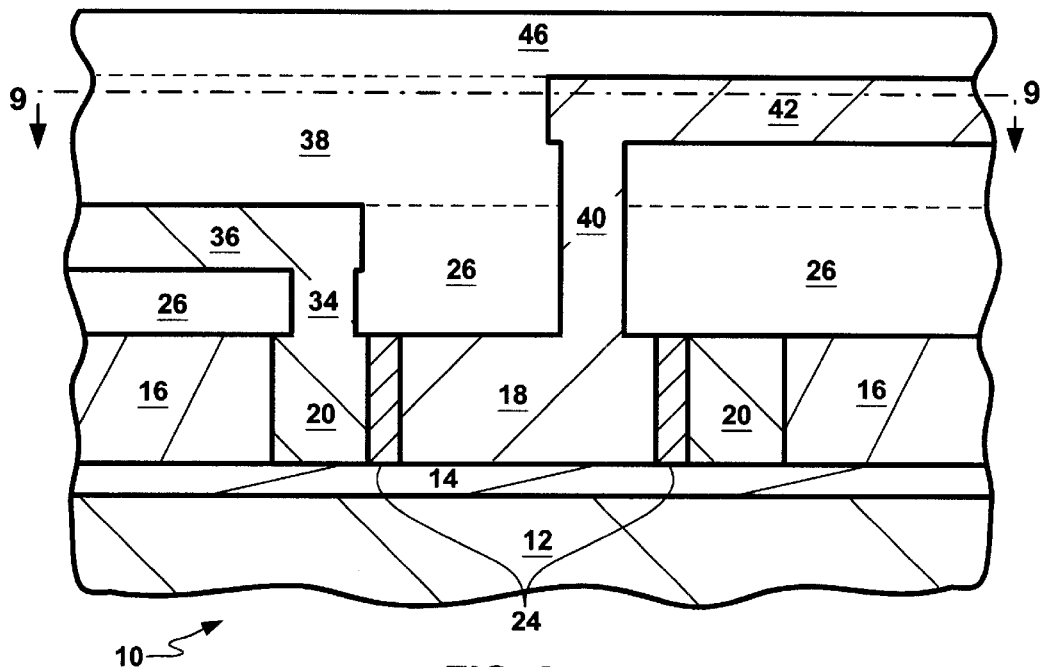
FIG. 8 is a diagramatic cross-section of the completed device of the present invention.

Referring now to FIG. 8, therein is shown a diagramatic cross-section of the completed device of the present invention with a further dielectric or oxide layer 46 deposited over the second channel dielectric 38 and the second channel 42.

Figure 9:
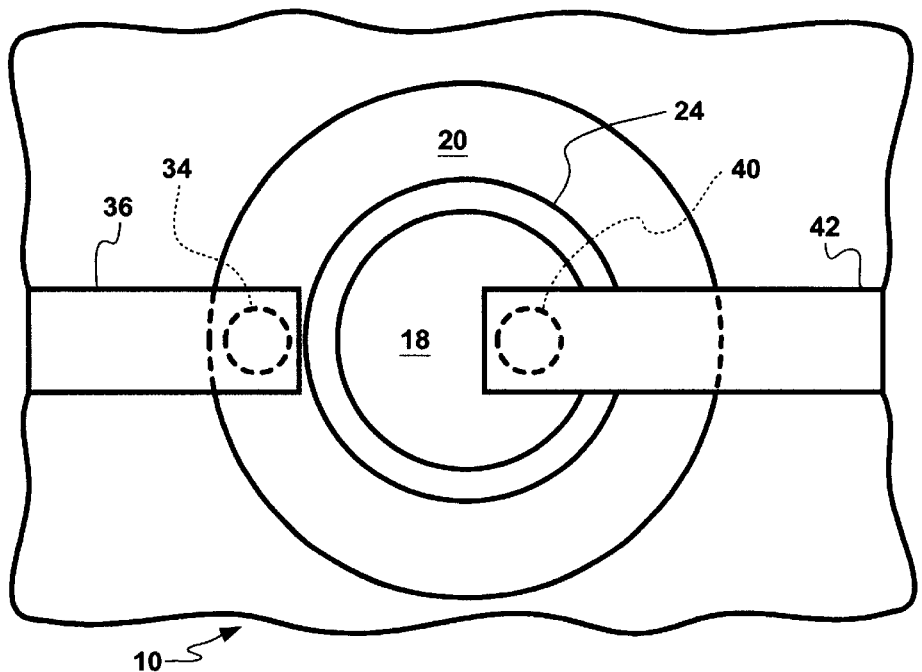
FIG. 9 is a top view of the present invention along line 9—9 of FIG. 8 with the interlayer dielectric removed.

Referring now to FIG. 9, therein is shown a top view of the present invention along line 9—9 of FIG. 8 with the interlayer dielectric removed. For ease of understanding, the first and second channel dielectrics 26 and 38 are not shown. It is shown that the first channel 36 is connected by the conductive via 34 to the conductive ring 20. The conductive ring 20 encompasses the dielectric ring 24 which in turn encompasses the cylinder 18 to form a cylindrical capacitor semiconductor device 10. The cylinder 18 is connected by the conductive via 40 to the second channel 42. It should be understood that the conductive vias 34 and 40 could be manufactured separately and could be contacts of tungsten, titanium, tantalum, and other refractory metals.

In operation, the first channel 36 could be an anode for a capacitor element made up of the conductive ring 20, the dielectric ring 24 and the cylinder 18 which forms the cathode with the conductive via 40 and the second channel 42. The capacitor 10 may be placed immediately adjacent the transistor or power line which it serves and connected by the first and second channels 36 and 42.

Also, a plurality of annular rings may be interconnected to form the anodes and cathodes of multiple nested capacitors.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for making a semiconductor capacitor comprising the steps of:
   providing a semiconductor substrate;
   depositing a dielectric layer on the semiconductor substrate;
   forming a core volume and a toroidal volume in the dielectric layer, the core and toroidal volumes spaced apart by a dielectric ring;
   depositing a conductive material in the core and toroidal volumes to respectively form a conductive core and a conductive ring;
   connecting a first channel to the conductive core; and
   connecting a second channel to the conductive ring.

2. The method for making a semiconductor capacitor as claimed in claim 1 including the steps of:
   removing the dielectric ring spacing the conductive core and the conductive ring; and
   depositing a second dielectric material to replace the dielectric ring removed.

3. The method for making a semiconductor capacitor as claimed in claim 1 including the steps of:
   removing the dielectric ring spacing the conductive core and the conductive ring; and
   depositing a high dielectric material having a dielectric constant about and above 20 to replace the dielectric ring removed.

4. The method for making a semiconductor capacitor as claimed in claim 1 including the steps of:
   removing the dielectric ring spacing the conductive core and the conductive ring; and
   depositing a high dielectric constant dielectric ring to replace the dielectric ring removed, the high dielectric constant dielectric ring is selected from a group consisting of tantalum pentoxide, barium strontium titanate, and combinations thereof.

5. The method for making a semiconductor capacitor as claimed in claim 1 including the step of:
   depositing a barrier layer in the core and toroidal volumes.

6. The method for making a semiconductor capacitor as claimed in claim 1 wherein the step of:
   depositing the conductive material uses an electroplating process;
   and includes the step of:
   removing the conductive material outside the core and toroidal volumes.

7. The method for making a semiconductor capacitor as claimed in claim 1 wherein the step of:
   the depositing of a conductive material is preceded by a step of depositing a material barrier material.

8. The method for making a semiconductor capacitor as claimed in claim 1 wherein the step of:
   depositing a conductive material uses a conductive material selected from a group consisting of aluminum, copper, silver, gold, an alloy thereof, a compound thereof, and polysilicon.

9. The method for making a semiconductor capacitor as claimed in claim 1 wherein the steps of:
   forming the core volume forms a cylinder; and
   forming the toroidal volume forms a rectangular toroid.

10. A method for making a cylindrical semiconductor capacitor comprising the steps of:
    providing a semiconductor substrate;
    depositing an oxide layer on the semiconductor substrate;
    forming a cylindrical volume and a toroidal volume in the oxide layer, the cylindrical and toroidal volumes spaced apart by an oxide ring;
    depositing a conductive material in the cylindrical and toroidal volumes to respectively form a conductive cylinder and a conductive ring;
    connecting a first channel to the conductive cylinder; and
    connecting a second channel to the conductive ring.

11. The cylindrical semiconductor capacitor as claimed in claim 10 including:
    depositing a second oxide layer on the oxide layer, the conductive cylinder and the conductive ring;
    forming the first channel and a via in the second oxide layer with the via in contact with the conductive cylinder;
    depositing a third oxide layer on the second oxide layer and the first channel;
    forming the second channel and a via in the third oxide layer with the via in contact with the conductive ring; and
    depositing a fourth oxide layer on the third oxide layer and the second channel.

12. The method for making a cylindrical semiconductor capacitor as claimed in claim 10 including the steps of:
    removing the oxide ring spacing the conductive cylinder and the conductive ring; and
    depositing a second dielectric material to replace the oxide ring removed.

13. The method for making a cylindrical semiconductor capacitor as claimed in claim 10 including the steps of:
    removing the oxide ring spacing the conductive cylinder and the conductive ring; and
    depositing a high dielectric material having a dielectric constant about and above 20; and
    chemical-mechanical polishing to leave the high dielectric material only between the conductive cylinder and conductive ring.

14. The method for making a cylindrical semiconductor capacitor as claimed in claim 10 including the steps of:
    removing the oxide ring spacing the conductive cylinder and the conductive ring;
    depositing a high dielectric constant dielectric material, the high dielectric constant dielectric material is selected from a group consisting of tantalum pentoxide, barium strontium titanate, and combinations thereof; and
    chemical-mechanical polishing to leave the high dielectric material only between the conductive cylinder and conductive ring.

15. The method for making a cylindrical semiconductor capacitor as claimed in claim 10 including the steps of:

depositing a barrier layer in the cylindrical and toroidal volumes.

16. The method for making a cylindrical semiconductor capacitor as claimed in claim 10 wherein the step of:

depositing the conductive material uses an electroplating process;

and includes the step of:

removing the conductive material outside the core and toroidal volumes.

17. The method for making a cylindrical semiconductor capacitor as claimed in claim 10 wherein the step of:

depositing a conductive material uses a conductive material selected from a group consisting of aluminum, copper, silver, gold, an alloy thereof, a compound thereof, and polysilicon.

* * * * *

UNITED STATES PATENT AND TRADEMARK OFFICE
CERTIFICATE OF CORRECTION

PATENT NO. : 6,265,280 B1
DATED : July 24, 2001
INVENTOR(S) : Pan

Page 1 of 1

It is certified that error appears in the above-identified patent and that said Letters Patent is hereby corrected as shown below:

<u>Column 4,</u>
Line 5, in the "Best Mode for Carrying Out the Invention" section: delete "bariam" and insert therefor -- barium --

Signed and Sealed this

Twenty-ninth Day of January, 2002

Attest:

*Attesting Officer*

JAMES E. ROGAN
*Director of the United States Patent and Trademark Office*